US011032957B2

(12) United States Patent
Ichino et al.

(10) Patent No.: US 11,032,957 B2
(45) Date of Patent: Jun. 8, 2021

(54) COMPONENT SUPPLY DEVICE

(71) Applicant: FUJI CORPORATION, Chiryu (JP)

(72) Inventors: Shinji Ichino, Nagoya (JP); Tsuyoshi Hamane, Toyota (JP); Toru Matsumoto, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 77 days.

(21) Appl. No.: 16/305,329

(22) PCT Filed: May 31, 2016

(86) PCT No.: PCT/JP2016/065968
§ 371 (c)(1),
(2) Date: Nov. 28, 2018

(87) PCT Pub. No.: WO2017/208323
PCT Pub. Date: Dec. 7, 2017

(65) Prior Publication Data
US 2020/0323110 A1 Oct. 8, 2020

(51) Int. Cl.
*B65G 47/14* (2006.01)
*B65G 47/12* (2006.01)
(Continued)

(52) U.S. Cl.
CPC ....... *H05K 13/021* (2013.01); *H05K 13/0417* (2013.01); *H05K 13/028* (2013.01);
(Continued)

(58) Field of Classification Search
None
See application file for complete search history.

(56) References Cited

U.S. PATENT DOCUMENTS 5,454,464 A * 10/1995 Yamamoto ......... B65G 47/1485
198/384
5,687,831 A 11/1997 Carlisle
(Continued)

FOREIGN PATENT DOCUMENTS

WO    WO 2015/097904 A1    7/2015

OTHER PUBLICATIONS

International Search Report dated Aug. 30, 2016 in PCT/JP2016/065968 filed on May 31, 2016.

*Primary Examiner* — Kavel Singh
(74) *Attorney, Agent, or Firm* — Oblon, McClelland, Maier & Neustadt, L.L.P.

(57) ABSTRACT

A loose component supply device including: component support member 150 configured to support multiple components in a scattered state; component collection container 180 configured to collect the components supported on the component support member via an opening in the component collection container; and a container oscillating device configured to scatter the components collected inside the component collection container onto the component support surface by swinging the component collection container such that the opening of the collection container faces the component support member. By this, because components are scattered on the component support member directly form the component collection container, the cycle time is shortened, thereby improving practicality of a component supply device.

4 Claims, 16 Drawing Sheets

(51) Int. Cl.
*B65G 47/00* (2006.01)
*H05K 13/02* (2006.01)
*H05K 13/04* (2006.01)
*H05K 13/08* (2006.01)

(52) U.S. Cl.
CPC ....... *H05K 13/0434* (2013.01); *H05K 13/086* (2018.08); *H05K 13/0813* (2018.08)

(56) References Cited

U.S. PATENT DOCUMENTS

| | | | | |
|---|---|---|---|---|
| 6,283,272 B1* | 9/2001 | Hsieh | ................. | B65G 47/1407 |
| | | | | 198/394 |
| 6,283,325 B1* | 9/2001 | Saito | .................... | B23P 19/001 |
| | | | | 221/200 |
| 6,374,986 B1* | 4/2002 | Oe | .................... | H05K 13/0417 |
| | | | | 198/396 |
| 6,471,094 B2* | 10/2002 | Saito | ................... | H05K 13/028 |
| | | | | 221/278 |
| 7,028,829 B2* | 4/2006 | Buchi | ................... | B65G 27/32 |
| | | | | 198/443 |
| 8,590,692 B2* | 11/2013 | Wooldridge | ......... | B65G 47/256 |
| | | | | 198/444 |
| 9,949,417 B2* | 4/2018 | Morikawa | ........... | B65G 47/145 |
| 10,039,218 B2* | 7/2018 | Kubota | .................. | H05K 13/04 |
| 10,080,320 B2* | 9/2018 | Nozawa | ............ | H05K 13/0084 |
| 2003/0042112 A1* | 3/2003 | Woerner | ........... | B65G 47/1471 |
| | | | | 198/446 |

* cited by examiner

COMPONENT SUPPLY DEVICE

TECHNICAL FIELD

The present application relates to a component supply device configured to supply components from a component support section that supports multiple components in a scattered state.

BACKGROUND ART

Among component supply devices, there is a known device that scatters components on a component support section from a component housing apparatus such as a hopper so as to supply the components in a scattered state. With such a component supply device, components scattered on the component support section are to be picked up by a suction nozzle or the like, but there are cases in which the components are scattered on the component support section in a state in which pickup is not possible. These components are temporarily collected into a collection container provided to the side of the component support section. The components are then returned to the component housing apparatus from the collection container and then scattered on the component support section from the component housing apparatus again. An example of such a component supply device is disclosed in the patent literature below.
Patent literature 1: WO2015/097904

BRIEF SUMMARY

Technical Problem

According to technology of the above patent literature, components collected into the collection container are returned to the component housing apparatus and then scattered on the component support section again such that the orientation of the components on the component support section changes, allowing the components to be picked up from the component support section. However, collecting components into the collection container from the component support section then returning the collected components to the component housing apparatus, and then scattering the components again from the component housing apparatus to the component support section increases the cycle time. Also, when components are returned to the component housing apparatus from the collection container, components may fall outside of the component housing apparatus, causing the component supply device to stop with an error. Thus, there is room for improvement in component supply devices that supply components supported on a component support section, and the practicality of a component supply device can be improved by performing various improvements. An object of the present disclosure is to provide a highly practical component supply device that takes account of the above circumstances.

Solution to Problem

To solve the above problems, a component supply device of the present disclosure includes: a component support section configured to support multiple component in a scattered state on a support surface; a collection container arranged next to the component support section and configured to collect the components supported on the support surface via an opening in the collection container; a collection device configured to cause the components supported on the support surface to be collected inside the collection container via the opening in the collection container; and a container orientation changing device configured to scatter the components collected inside the collection container onto the support surface by changing the orientation of the collection container such that the opening of the collection container faces the support surface.

Advantageous Effects

With a component supply according to the present disclosure, components collected inside the collection container are scattered on the support surface of the component support section by changing the orientation of the collection container such that an opening of the collection container faces the support surface of the component support section. By this, it is not necessary to return components collected in the collection container to the component housing apparatus, thus there is no problem with components falling when being returned to the component housing apparatus from the collection container. Also, because components are scattered on the component support section directly from the collection container, the cycle time is shorter. Therefore, a component supply device of the present disclosure has improved practicality.

DESCRIPTION OF PREFERRED EMBODIMENTS

Figure 1:
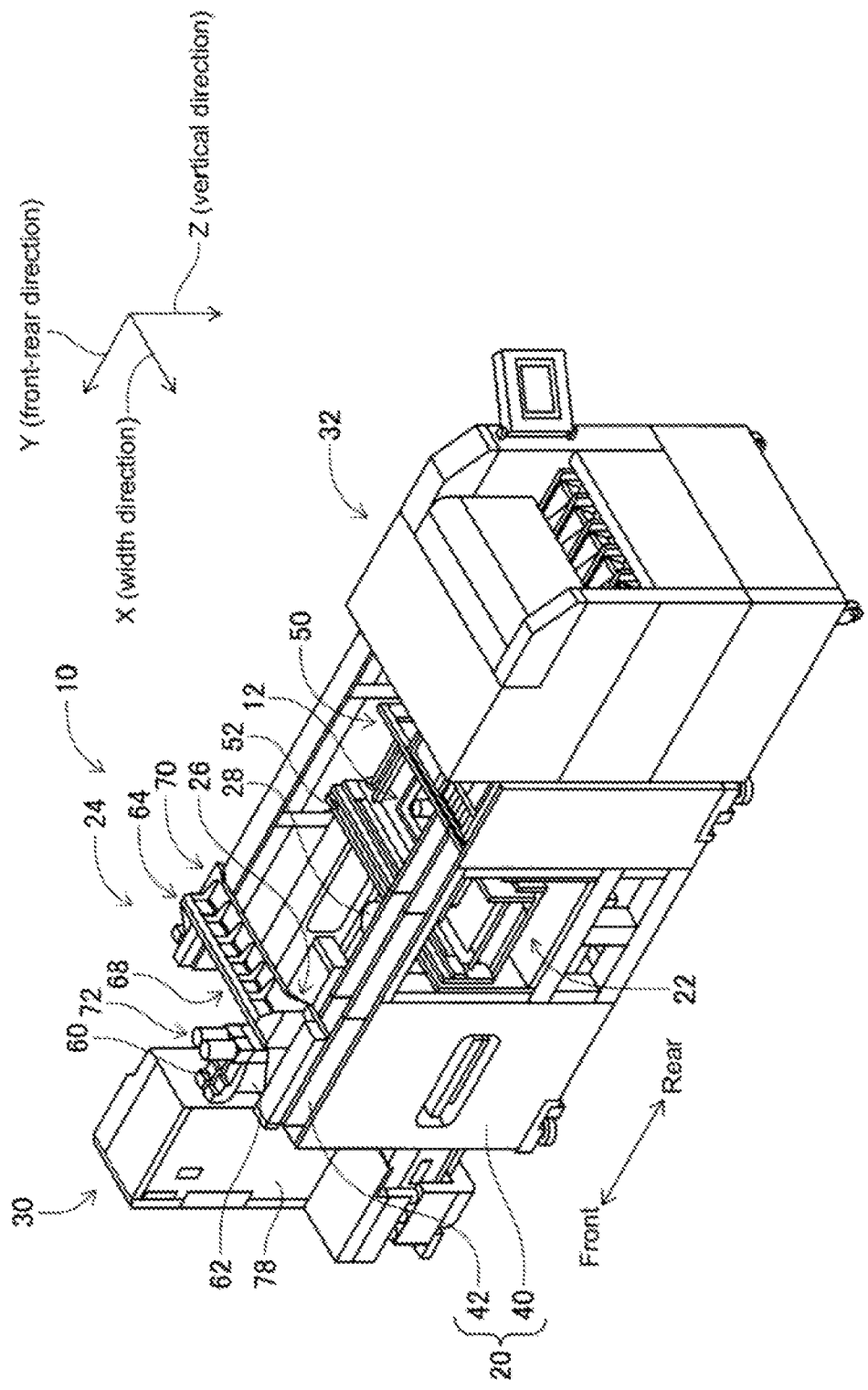
FIG. 1 is a perspective view of a component mounter.

The following describes in detail referring to the figures an example embodiment of the present disclosure.
Configuration of Component Mounter
FIG. 1 shows component mounter 10. Component mounter 10 performs work of mounting components on circuit board 12. Component mounter 10 is provided with device main body 20, board conveying and holding device 22, component mounting device 24, imaging devices 26 and 28, component supply device 30, loose component supply device 32, and control device 34 (refer to FIG. 14). Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
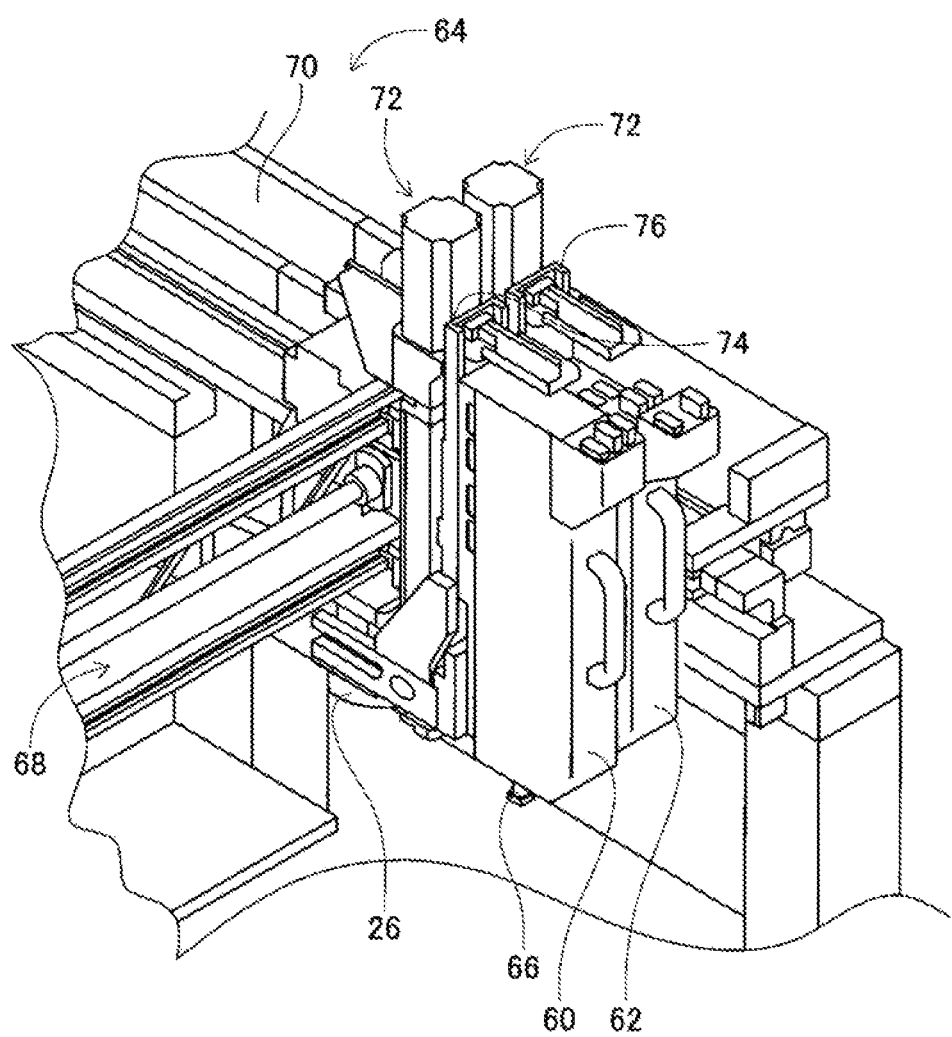
FIG. 2 is a perspective view of a component mounting device of the component mounter.

Component mounting device 24 is provided on beam section 42 and includes work heads 60 and 62 and work head moving device 64. Each work head 60 and 62 includes suction nozzle 66 (refer to FIG. 2) and holds a component using suction nozzle 66. Further, work head moving device 64 includes X-direction moving device 68, Y direction moving device 70, and Z-direction moving device 72. Work heads 60 and 62 are moved together to any position on frame 40 by X-direction moving device 68 and Y-direction moving device 70. Also, as shown in FIG. 2, work head 60 and 62 are detachably attached to sliders 74 and 76 respectively, and Z direction moving device 72 moves sliders 74 and 76 in a vertical direction individually. That is, work heads 60 and 62 are moved in a vertical direction individually by Z-direction moving device 72.

Imaging device 26 is attached to slide 74 in a state facing downwards, and is moved in the X direction, Y direction, and Z direction together with work head 60. Thus, imaging device 26 images any position on frame section 40. As shown in FIG. 1, imaging device 28 is provided in a state facing upwards on frame section 40 between board conveying and holding device 22 and component supply device 30. By this, imaging device 28 images a component held by suction nozzle 66 of work heads 60 and 62.

Component supply device 30 is provided at an end of frame section 40 in the front-rear direction. Component supply device 30 includes tray-type component supply device 78 and feeder type component supply device (not shown). Tray-type component supply device 78 supplies components in a state arranged in a tray. The feeder type component supply device supplies components via a tape feeder (not shown) or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. The configuration of component supply device 32 is described below in detail. Note that, components supplied by component supply device 30 and loose component supply device 32 may include electronic circuit components, configuration components of solar panels, configuration components of power modules, and the like. Also, electronic circuit components include components with leads and components without leads.

Figure 3:
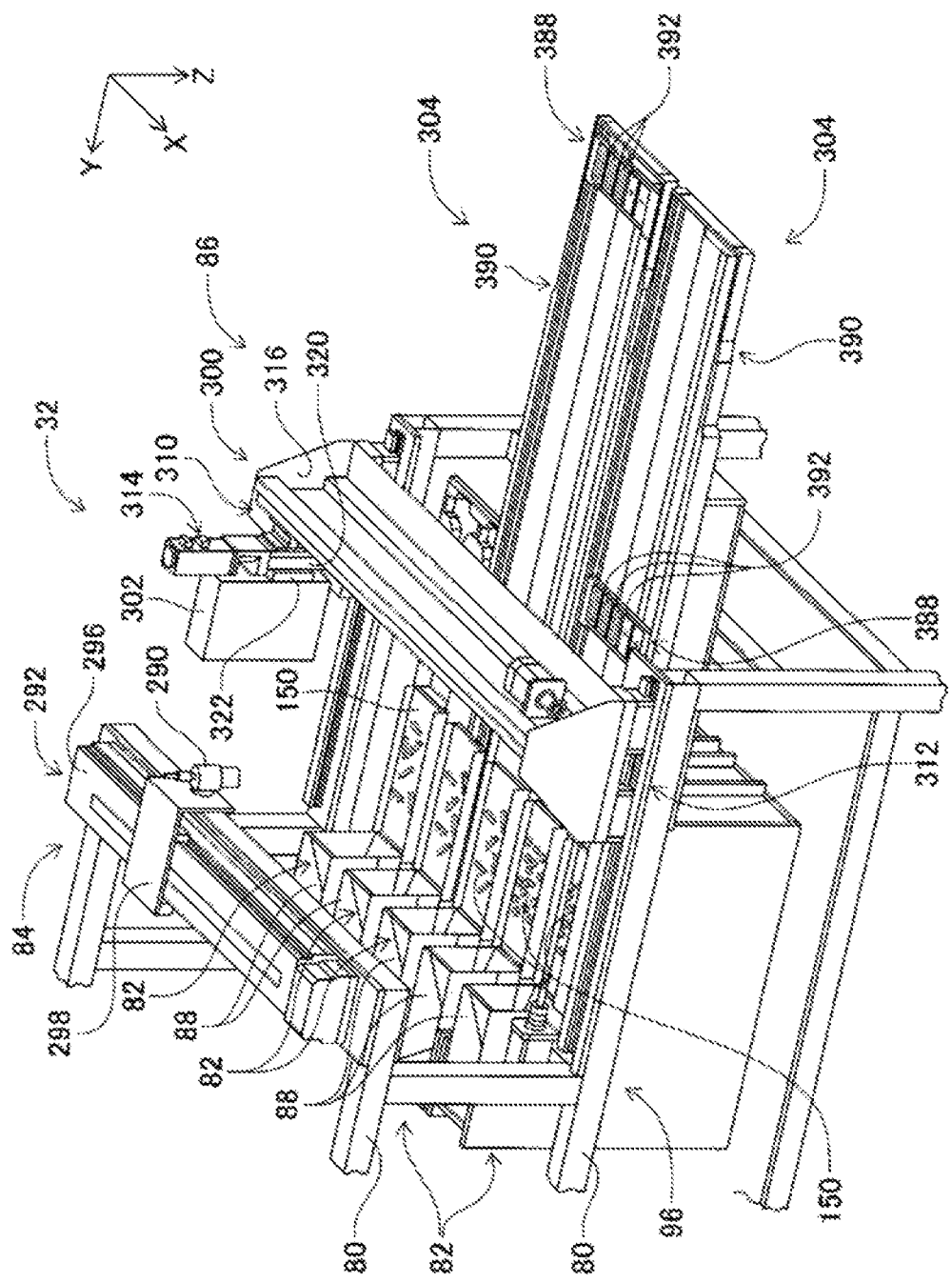
FIG. 3 is a perspective view of a loose component supply device.

As shown in FIG. 3, loose component supply device 32 includes main body 80, component supply unit 82, imaging device 84, and component transfer device 86.

(a) Component Supply Unit

Component supply unit 82 includes component supply apparatus 88, component scattering device 90 (refer to FIG. 4), and component returning device 92 (refer to FIG. 5), with component supply apparatus 88, component scattering device 90, and component returning device 92 being integrated into one unit. Component supply unit 82 is assembled to be removable from base 96 of main body 80, and with loose component supply device 32, five component supply units 82 are arranged in one row in the X direction.

(i) Component Supply Apparatus

Figure 4:
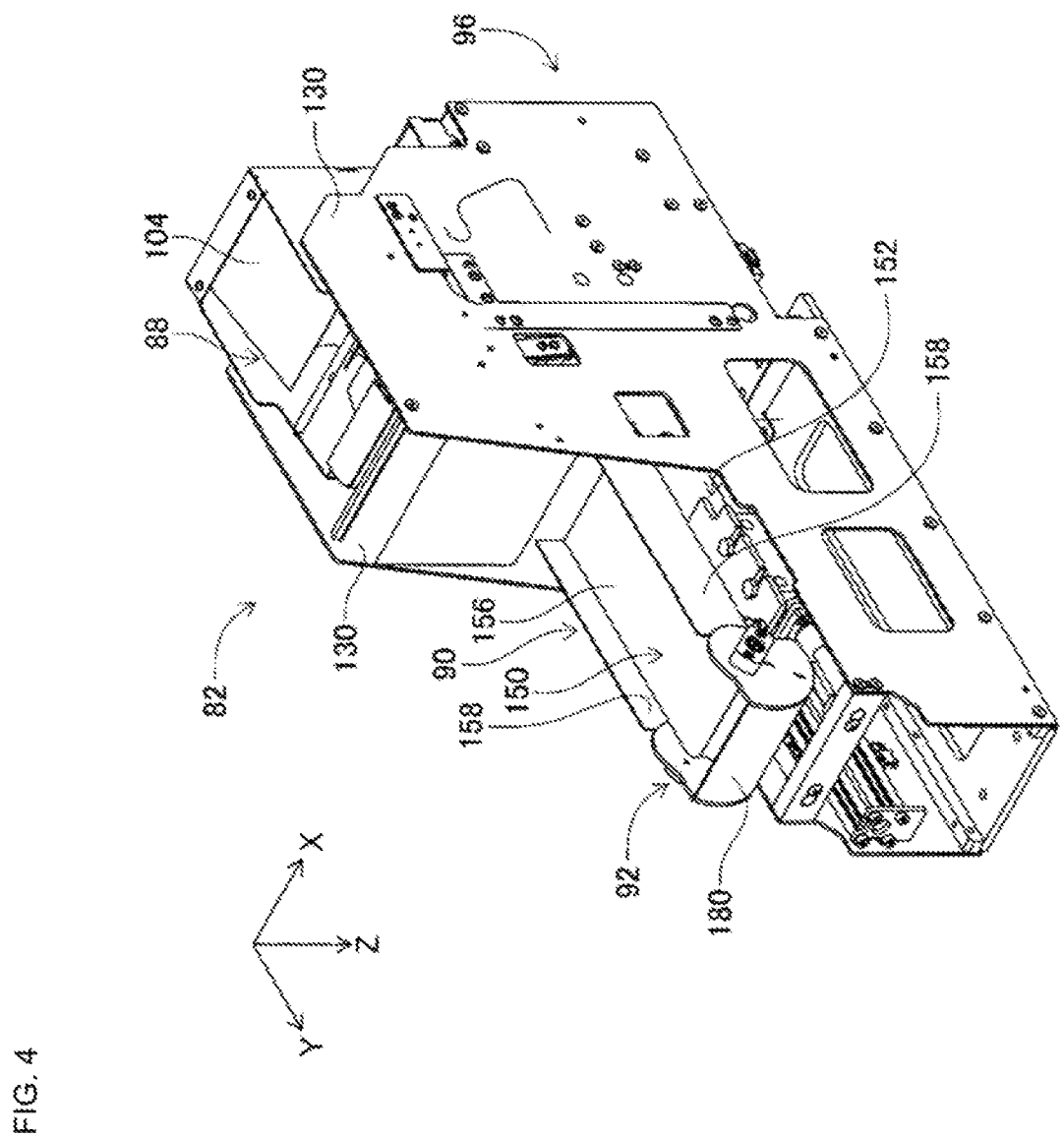
FIG. 4 is a perspective view of a component supply unit.
Figure 5:
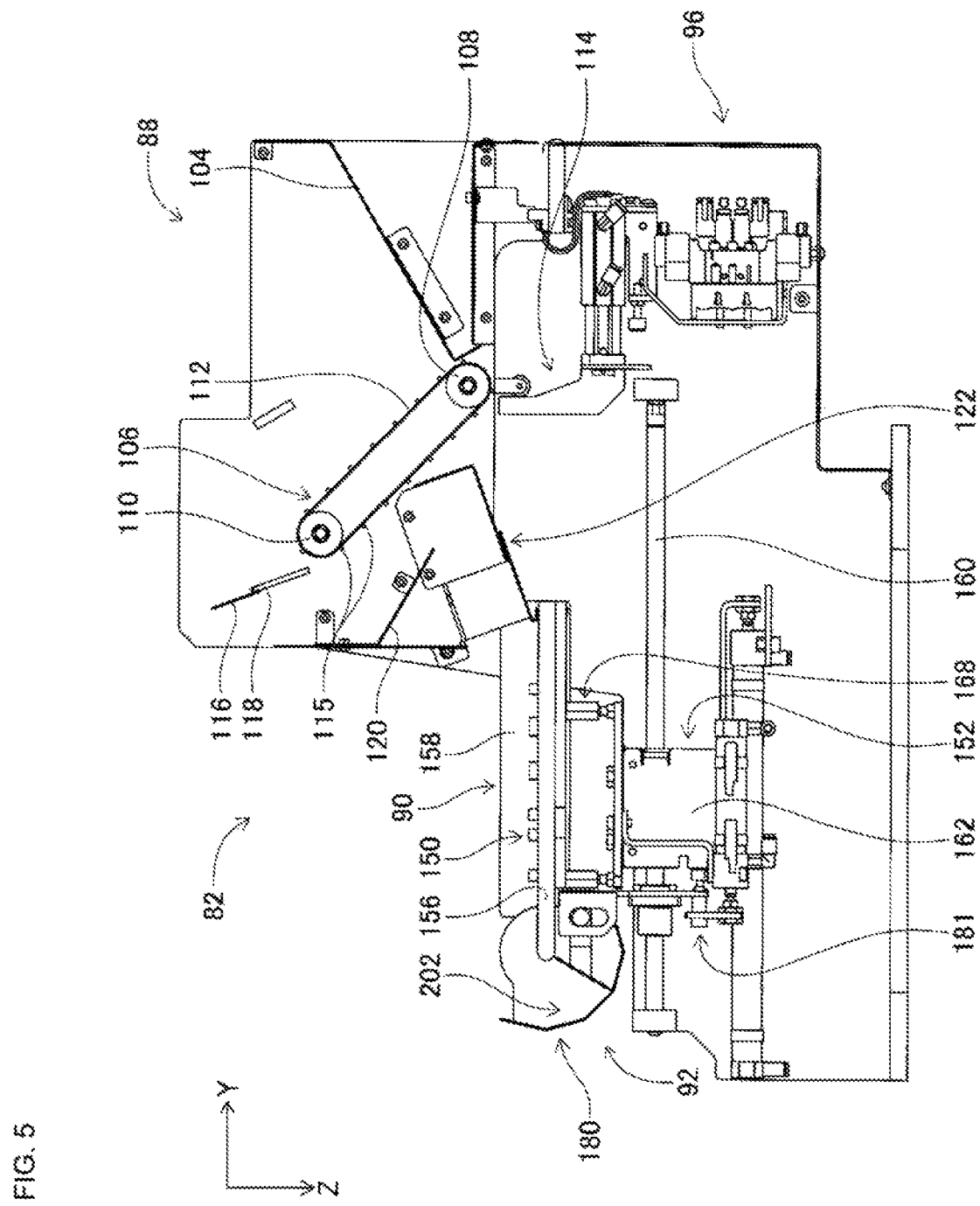
FIG. 5 is a cross section view of the component supply unit.

As shown in FIGS. 4 and 5, component supply apparatus 88 is a substantially cuboid box arranged to extend in the Y direction. The Y direction is the front-rear direction of component supply apparatus 88 with the left side in FIG. 5 sometimes referred to as the front and the right side in FIG. 5 sometimes referred to as the rear. That is, in component supply unit 82, the side towards the end at which component returning device 92 is arranged is sometimes referred to as the front, and the side towards the end at which component supply apparatus 88 is arranged is sometimes referred to as the rear.

Component supply apparatus 88 has openings at the upper surface and front surface, and inclined plate 104 is arranged below the opening at the upper surface of component supply apparatus 88. Inclined plate 104 is arranged across the entire width (X direction) of component supply apparatus 88 and is inclined from the rear end surface of component supply apparatus 88 towards the center such that the front end of inclined plate 104 is positioned lower than the rear end.

Also, as shown in FIG. 5, conveyor device 106 is arranged at the front side of inclined plate 104. Conveyor device 106 includes a pair of rollers 108 and 110, and conveyor belt 112. Each of the rollers 108 and 110 are arranged inside component supply apparatus 88 extending in the width direction of component supply apparatus 88 across the entire width of component supply apparatus 88. Further, roller 108 faces the front end of inclined plate 104, that is, the lowest end of inclined plate 104, with a clearance gap between them. Note that, the clearance between the front end of inclined plate 104 and roller 108 is smaller than components that are supplied by component supply apparatus 88. Also, roller 110 is arranged diagonally above and to the front of roller 108. Conveyor belt 112 is stretched over the pair of rollers 108 and 110. Note that, conveyor belt 112 has a width slightly less than the internal width dimension of component supply apparatus 88.

Also, the pair of rollers 108 and 110 are rotatable around their center axis, with rotation being controlled by operation of rotation device 114. The rotation direction of rollers 108 and 110 is the counterclockwise direction in FIG. 5. Thus, conveyor belt 112 revolves around rollers 108 and 110 in a counterclockwise direction in FIG. 5. In other words, the conveyance direction of conveyor belt 112 is diagonally up from the front end of inclined plate 104. Multiple protrusions 115 are formed on the upper surface, that is, the conveyance surface, of conveyor belt 112 extending across the width of conveyor belt 112. The multiple protrusions 115 are formed at specified intervals in the revolving direction of conveyor belt 112 with the intervals being longer than the length direction of components supplied by component supply apparatus 88.

Also, brush holding section 116 is arranged diagonally above and in front of roller 110 of conveyor device 106. Brush holding section 116 is arranged extending in the width direction of component supply apparatus 88 across the entire width of component supply apparatus 88. Brush 118 is attached to the lower end of brush holding section 116 extending towards roller 110 of conveyor device 106. The width dimension of brush 118 is slightly smaller than the internal width dimension of component supply apparatus 88 and faces conveyor belt 112 wound around roller 110 across the entire width direction of component supply apparatus 88 with a clearance gap between brush 118 and conveyor belt 112. The clearance between the tip of brush 118 and conveyor belt 112 wound around roller 110 is longer than the thickness dimension of components supplied by component supply apparatus 88 and less than two times the thickness dimension of components supplied by component supply apparatus 88.

Also, inclined plate 120 is arranged diagonally below and in front of roller 110 of conveyor device 106. Inclined plate 120 is arranged across the entire width of component supply apparatus 88 and is inclined from the front end surface of component supply apparatus 88 to below roller 110 such that the rear end of inclined plate 120 is positioned lower than the front end. Further, inclined plate 122 is arranged below inclined plate 120. Inclined plate 120 is arranged across the entire width of component supply apparatus 88 and is inclined from below a central portion of conveyor device 106 towards the front side opening of component supply apparatus 88 such that the front end of inclined plate 122 is positioned lower than the rear end. The rear end of inclined plate 122 is positioned further to the rear than the rear end of inclined plate 120, and the rear end of inclined plate 122 is bent upwards at a right angle. The front end of inclined plate 122 is bent to the rear to be substantially horizontal.

As shown in FIG. 4, pair of side frame sections 130 are assembled on base 96. The pair of side frame sections 130 are parallel to each other and are arranged upright extending in the Y direction. The distance between the pair of side frame sections 130 is slightly larger than the width dimension of component supply apparatus 88, with component supply apparatus 88 being detachably mounted between the pair of side frame sections 130.

(ii) Component Scattering Device

Component scattering device 90 includes component support member 150 and component support member moving device 152. Component support member 150 is configured from stage 156 and pair of side walls 158. Stage 156 is a substantially rectangular plate and is arranged extending forwards from below component supply apparatus 88 mounted between pair of side frame sections 130. Note that, the upper surface of stage 156 is substantially horizontal and, as shown in FIG. 5, is arranged with a small clearance gap from the bent front end of inclined plate 122 of component supply apparatus 88. Also, as shown in FIG. 4, pair of side walls 158 is fixed upright at both ends of stage 156 in the lengthwise direction, with the upper end of each side wall 158 extending above the upper surface of stage 156.

Further, as shown in FIG. 5, component support section moving device 152 includes guide rail 160 and slider 162. Guide rail 160 extends in the lengthwise direction of stage 156 below component support member 150. Slider 162 is slidably attached to guide rail 160 so as to be slid to any position by operation of electromagnetic motor 166 (refer to FIG. 14). Stage 156 of component support member 150 is connected to slider 162 via connection mechanism 168. Thus, component support member 150 moves in the Y direction by operation of component support member moving device 152, so as to move to and from a stored state (refer to FIG. 6) stored below component supply apparatus 88 and an exposed state (refer to FIG. 5) drawn out from below component supply apparatus 88.

(iii) Component Returning Device

Figure 9:
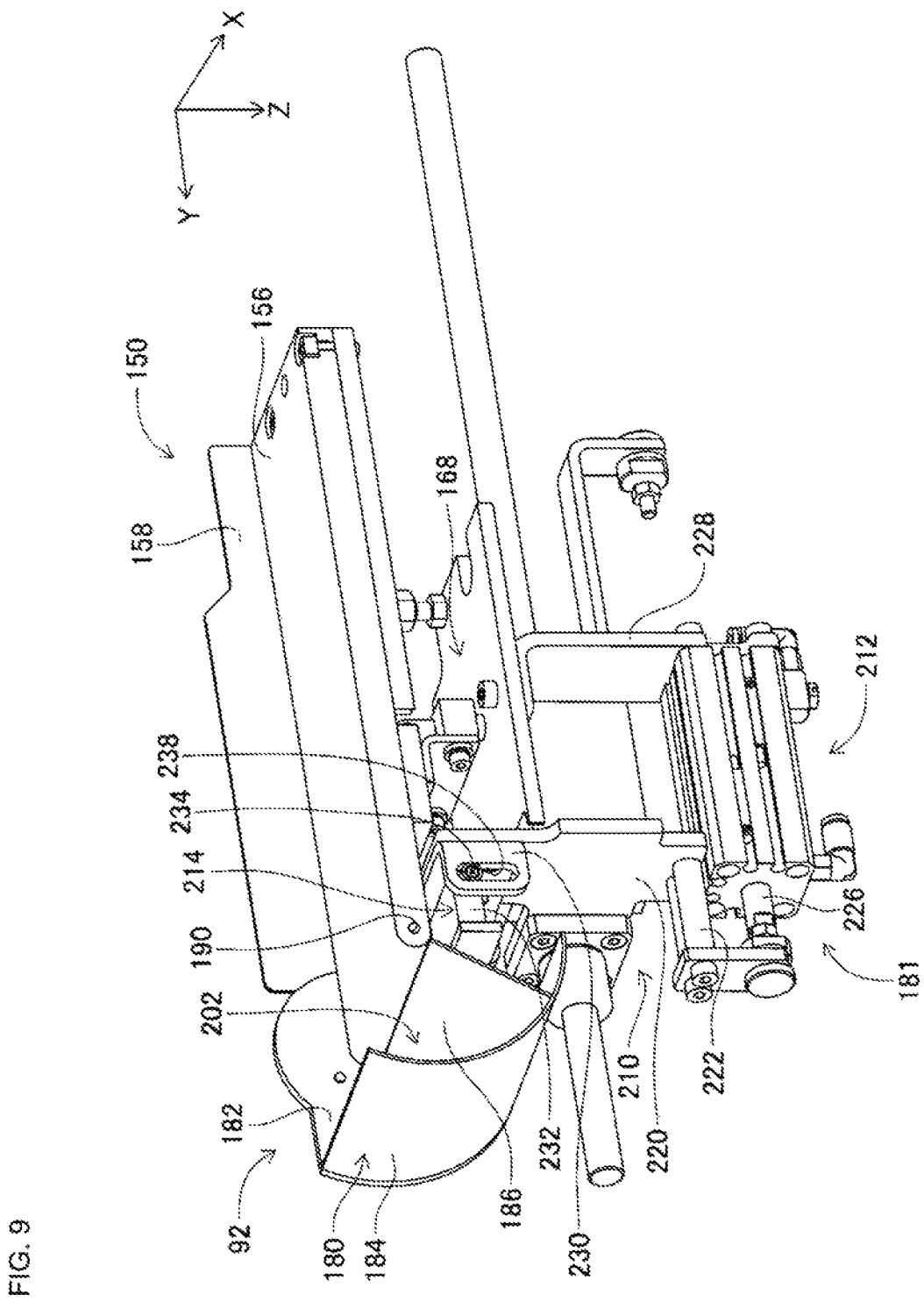
FIG. 9 is a perspective view of the component scattering device.
Figure 10:
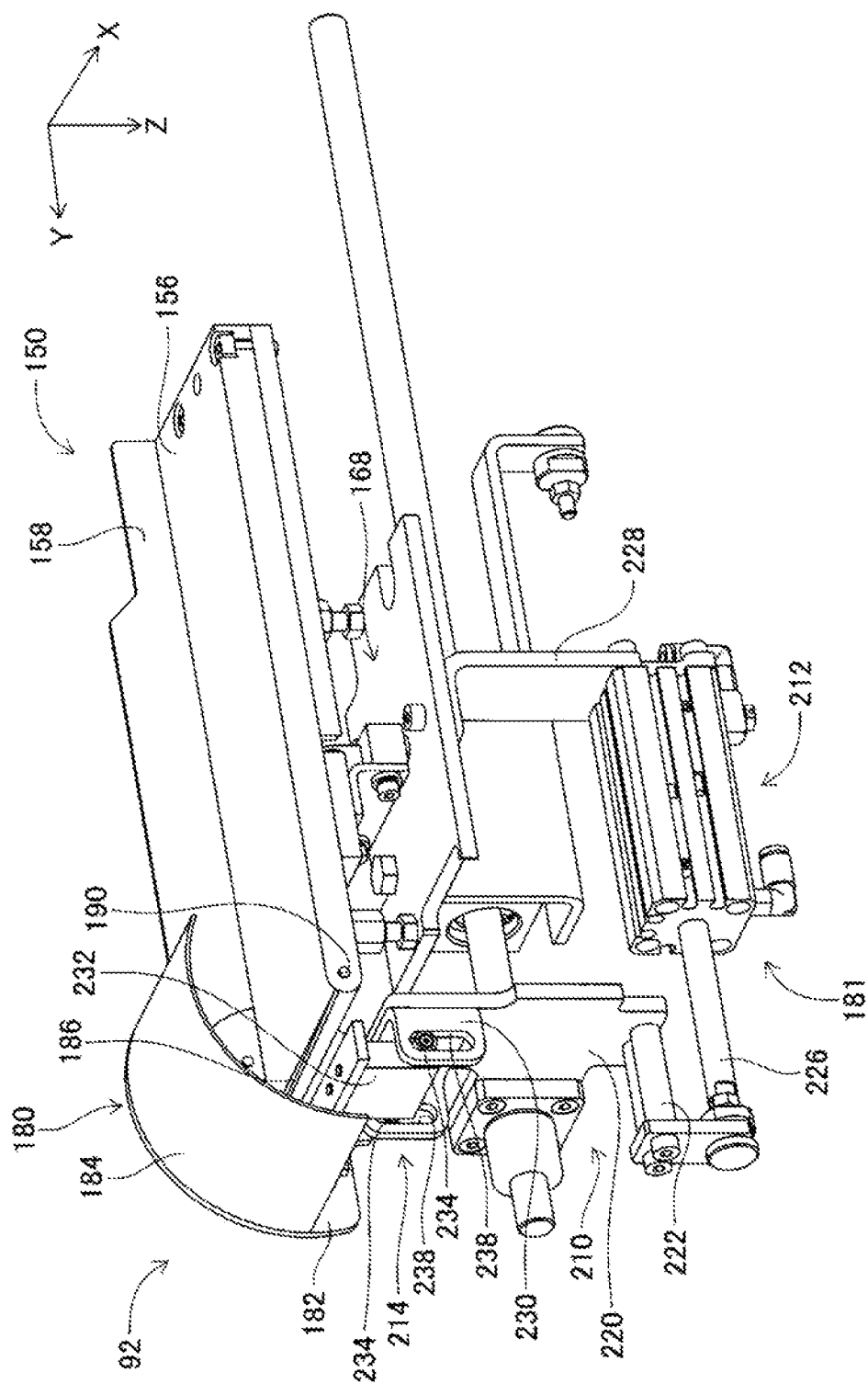
FIG. 10 is a perspective view of the component scattering device.

As shown in FIG. 5, component returning device 92 includes component collection container 180 and container oscillating device 181. As shown in FIGS. 7 to 10, component collection container 180 is configured from pair of side walls 182, bottom surface 184, and divider 186. In FIGS. 9 and 10, component collection container 180 is shown with one of the pair of side walls 182 removed.

Each of the pair of side walls 182 is approximately fan shaped and includes an arced section with a center angle of about 90 degrees. Bottom surface 184 is curved along arced section 188 of side walls 182 and both curved edges of bottom surface 184 are respectively fixed to arced section 188 of the pair of side walls 182. Divider 186 is a plate provided at a central portion in the bending direction of the bent bottom surface 184 in a state sandwiched between the pair of side walls 182. Thus, the inside of component collection container 180 is demarcated by the pair of side walls 182 and bottom surface 184 and is divided by divider 186.

The distance between the pair of side walls 182 is slightly larger than the widthwise (X direction) dimension of stage 156 of component support member 150, and the front end of stage 156 is sandwiched by the pair of side walls 182. Also, component collection container 180 is supported at the front end of stage 156 to the pair of side walls 182 in a swingable manner. In detail, through-hole 190 (refer to FIGS. 9 and 10) is formed at the front end of stage 156 extending in the widthwise direction of stage 156. Through-hole 192 (refer to FIGS. 7 and 8) is formed in a central portion of side wall 182 on the side opposite to arced section 188 coaxially with through hole 190. Oscillation shaft 196 (refer to FIGS. 7 and 8) is inserted into through hole 192 of the pair of side walls 182 and through-hole 190 of stage 156. By this, component collection container 180 is supported at the front end of stage 156 to the pair of side walls 182 in a swingable manner.

Figure 7:
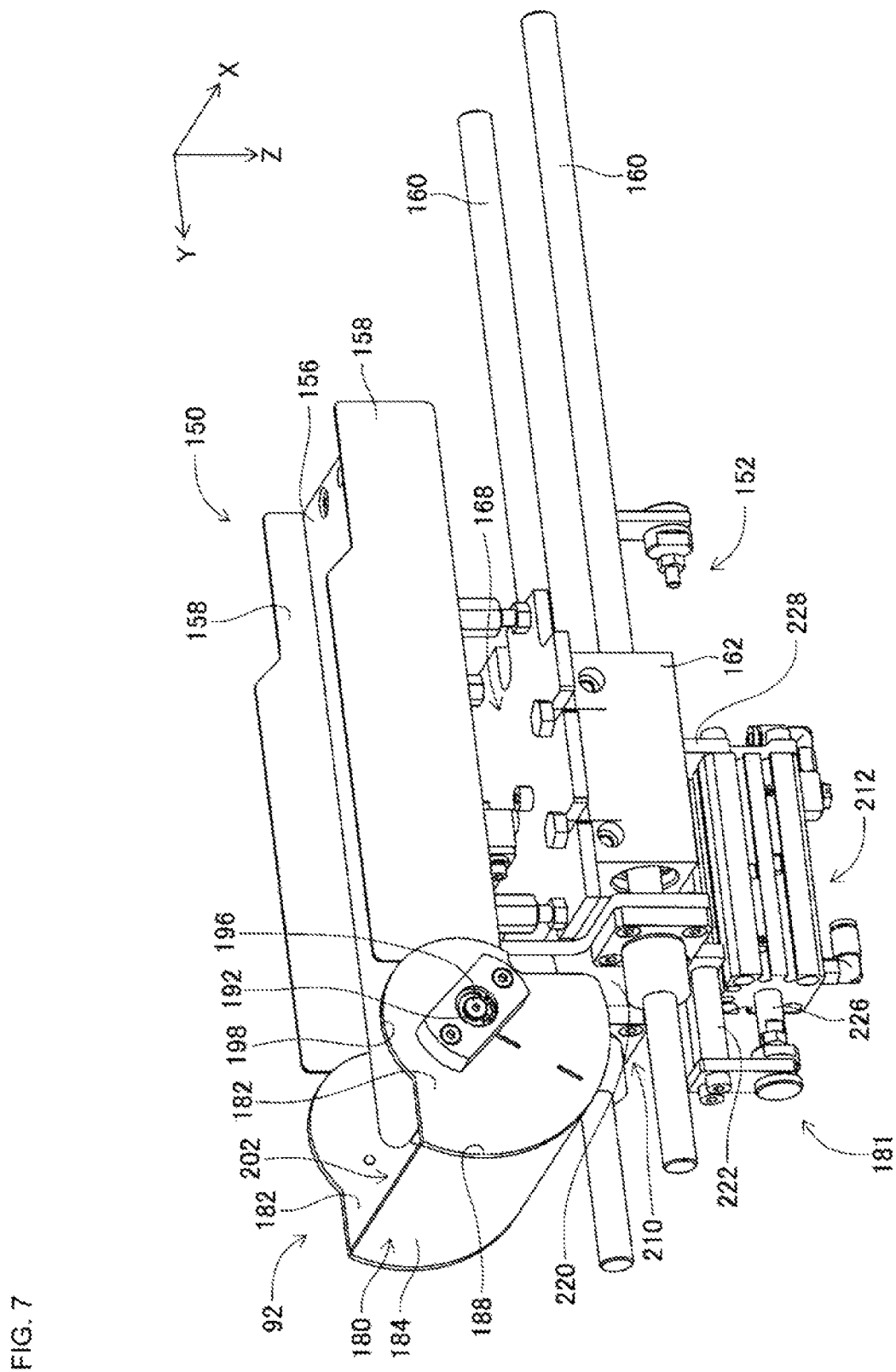
FIG. 7 is a perspective view of a component scattering device.
Figure 8:
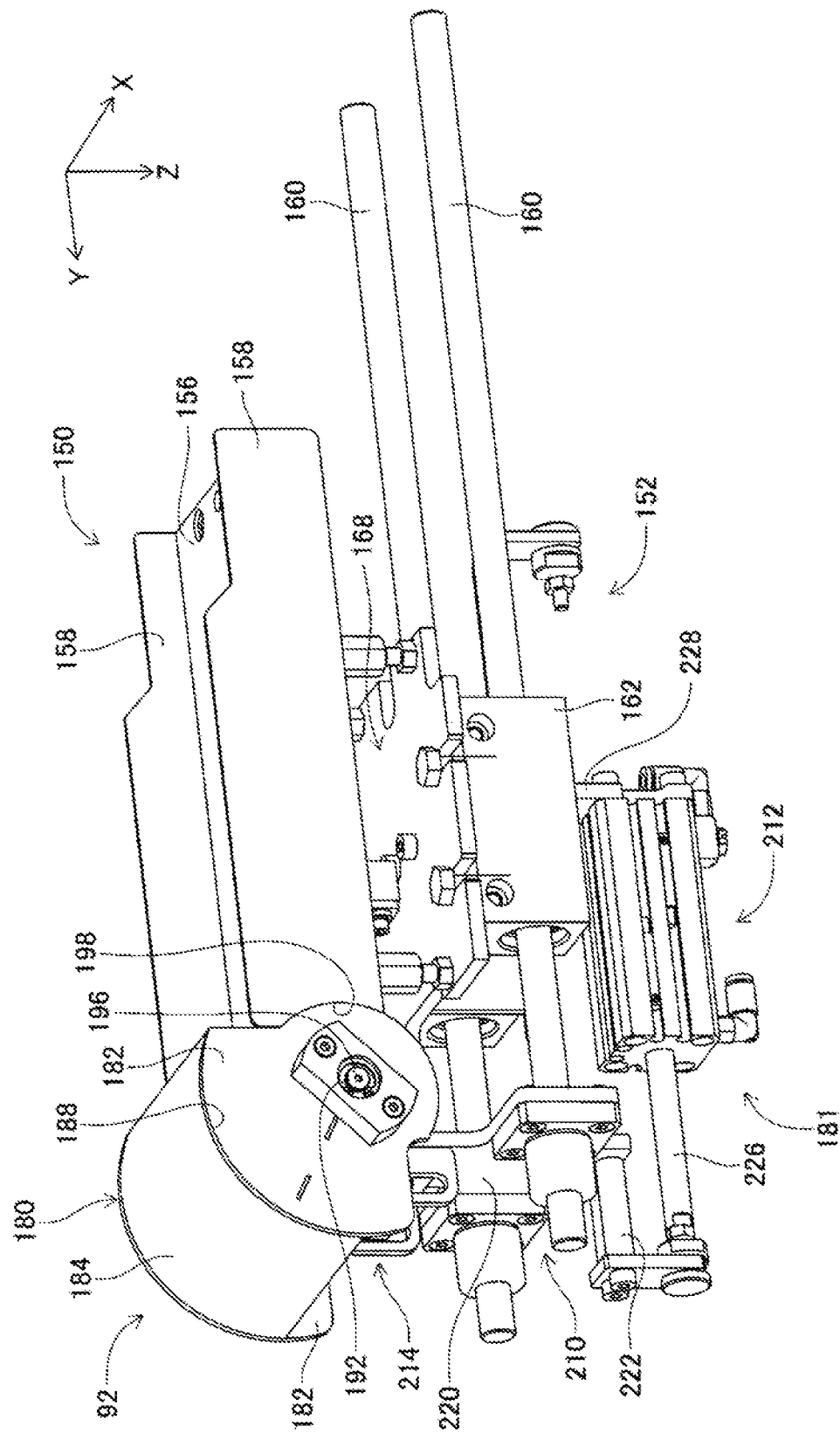
FIG. 8 is a perspective view of the component scattering device.
Figure 11:
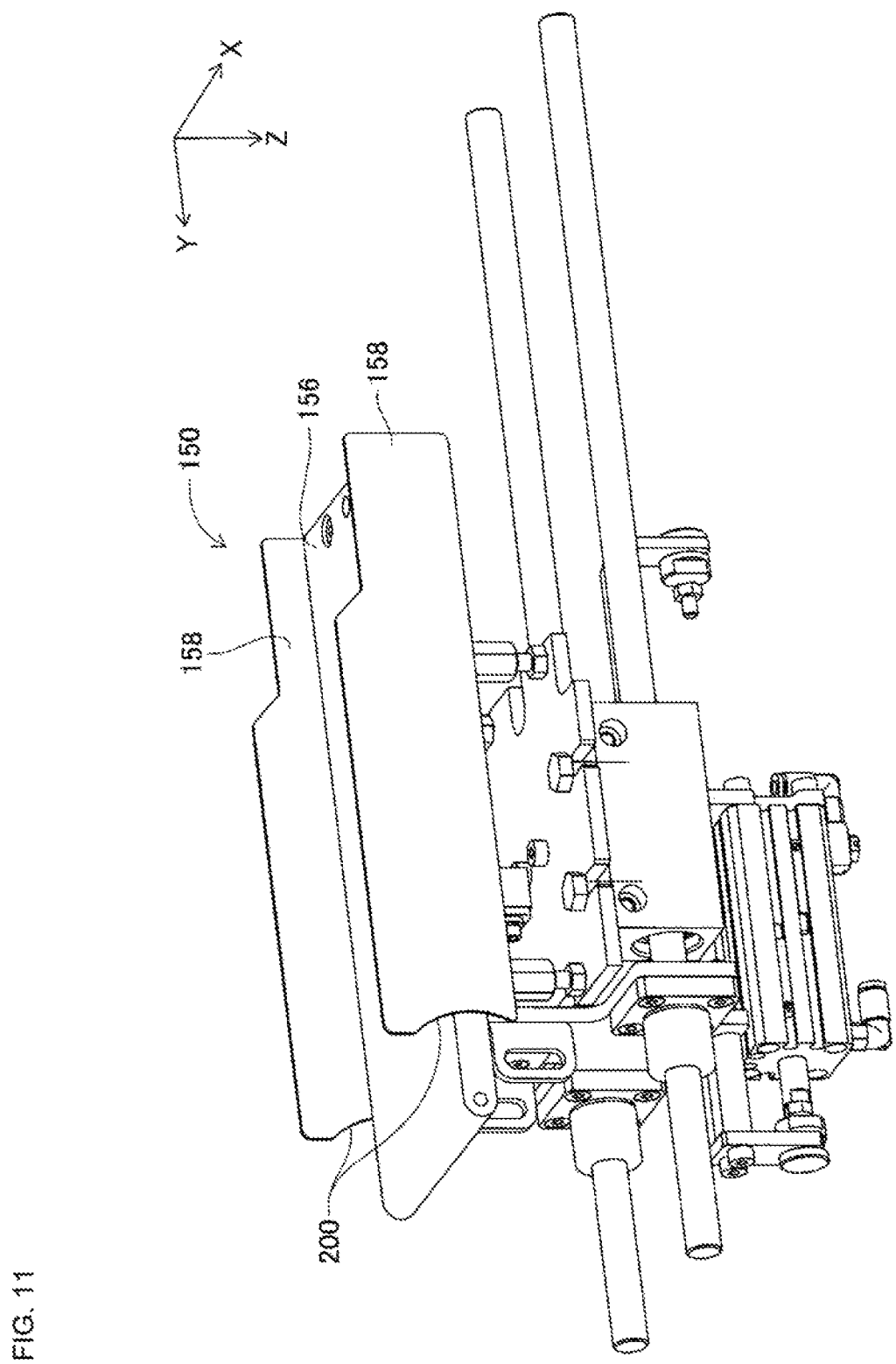
FIG. 11 is a perspective view of the component scattering device.

As shown in FIGS. 7 and 8, edges 198 of side walls 182 of component collection container 180 on the opposite to arced sections 188 are also arced. Further, edges 198 face the front end of side walls 158 fixed to the sides of stage 156 and, as shown in FIG. 11, arced cutouts 200 with approximately the same shape as edges 198 of side walls 182 are formed at the front end of side walls 158. Note that, FIG. 11 shows component support member 150 with component collection container 180 removed. Also, edges 198 of side walls 182 and cutouts 200 of side walls 158 face each other with a slight clearance between them. Thus, component collection container 180 can oscillate without interfering with side walls 158 of component support member 150.

As shown in FIGS. 9 and 10, divider 186 that divides the inside of component collection container 180 extends towards through hole 190 formed in stage 156, that is, towards the swinging center of component collection container 180. Therefore, the space demarcated by the front end of divider 186, bottom surface 184, and side walls 182 is an opening at the front end of stage 156 and functions as collecting section 202 of component collection container 180.

Divider 186 is at a right angle with respect to a straight line in the swinging direction of component collection container 180. Therefore, the distance between the end of divider 186 extending towards stage 156 and the swinging center of component collection container 180 remains constant even when component collection container 180 swings. Also, the front end of stage 156, that is, the end at which through-hole 190 is formed, is an arced surface shape to match the swinging direction of component collection container 180. This arced surface faces the end of divider 186 that extends towards stage 156 with a slight clearance gap between them. Therefore, when component collection container 180 swings, a constant clearance gap is maintained between the arced surface of stage 156 and the end of divider 186 that extends towards stage 156.

Container swinging device 181 includes slider 210, air cylinder 212, and cam mechanism 214. Slider 210 is configured from main body section 220 and connecting section 222. Main body section 220 of slider 210 is slidably attached to guide rail 160 of component support member moving device 152. Connecting section 222 is approximately L shaped and is fixed to the lower end of main body section 220 extending forward and down.

Air cylinder 212 is provided extending in the Y direction such that the front end of piston rod faces the rear, and is fixed to connecting mechanism 168 of component support member moving device 152 via bracket 228. The front end of piston rod 226 is fixed to a portion of slider 210 that extends below connecting section 222. Therefore, slider 210 and air cylinder 212 move in the Y direction together with stage 156 in accordance with movement of stage 156. Slider 210 is moved towards and away from connecting mechanism 168 by operation of air cylinder 212. Note that, when slider 210 is moved to its closest position to connecting mechanism 168 due to the operation of air cylinder 212, slider 210 is positioned below 156 (refer to FIG. 9), and when slider 210 is at its furthest position from connecting mechanism 168, slider 210 is positioned slightly forward of the front end of stage 156 (refer to FIG. 10).

As shown in FIGS. 9 and 10, cam mechanism 214 includes holding member 210, pushing member 232, and pair of rollers 234. Holding member 230 is a plate with both ends folded 90 degrees in the same direction and is fixed to the upper end of main body section 220 of slider 210 with the bent ends facing forward. A pair of cam holes 238 that extend in a vertical direction are formed in the bent ends of holding member 230.

Pushing member 232 is approximately rectangular and a pair of rollers 234 are rotatably provided on opposing surfaces of pushing member 232. Pushing member 232 is held in the bent ends of holding member 230 with the pair of rollers 234 inserted into the pair of cam holes 238. Pushing member 232 extends towards component collection container 180 from between the bent ends of holding member 230 and is fixedly sandwiched by the pair of side walls of component collection container 180. According to this configuration, component collection container 180 is swung by slider 210 being moved by operation of air cylinder 212.

In detail, as shown in FIGS. 7 and 9, when air cylinder 212 is fully retracted, slider 210 is positioned below the front end of stage 156, and rollers 234 of cam mechanism 214 are engaged at the top of cam holes 238. In this state, pushing member 232 is substantially horizontal, and component collection container 180 to which pushing member 232 is fixed is in a collection orientation with the opening of collecting section 202 facing up. With component collection container 180 in the collection orientation, divider 186 is inclined approximately 45 degrees to be lowered from the opening of collecting section 202 towards bottom surface 184.

When air cylinder 212 is extended from the fully retracted position, slider 210 moves away from connecting mechanism 168, and pushing member 232 of cam mechanism 214 also moves away from connecting mechanism 168 in accordance with the movement of slider 210. By this, component collection container 180 is pushed in a direction away from connecting mechanism 168 by pushing member 232 and is started to be swung. In other words, the end of the bottom surface 184 side of divider 186 of component collection container 180 is raised, and the opening of collecting section 202 is rotated towards the upper surface of stage 156. Here, the end of pushing member 323 fixed to component collection container 180 is raised and inclined in accordance with the swinging of component collection container 180. Therefore, the end of pushing member 323 opposite to the end fixed to component collection container 180, that is, the end with rollers 234 attached, is lowered, such that rollers 234 move down inside cam holes 238. When the end of pushing member 232 fixed to component collection container 180 has been raised to the height of the swinging center of component collection container 180, that is, the axis center of oscillation shaft 196, in accordance with the swinging of component collection container 180, rollers 234 are lowered to the bottom end of cam holes 238.

Continuing, when air cylinder 212 is extended further, slide 210 and pushing member 232 of cam mechanism 214 are moved further away from connection mechanism 168 and component collection container 180 is swung further. Here, the end of pushing member 232 fixed to component collection container 180 is raised to a height higher than the swinging center of component collection container 180, that is, the axis center of oscillation shaft 196, and rollers 234 are raised inside cam holes 238. Then, when air cylinder 212 is fully extended, as shown in FIGS. 8 and 10, slider 210 is moved forward of the front end of stage 156 and rollers 234 are raised to the top of cam holes 238. In this state, pushing member 232 is substantially vertical, and component collection container 180 to which pushing member 232 is fixed is in a returning orientation with the opening of collecting section 202 facing the upper surface of stage 156. With component collection container 180 in the returning orientation, divider 186 is inclined approximately 45 degrees to be lowered from bottom surface 184 towards the opening of collecting section 202.

(b) Imaging Device

As shown in FIG. 3, imaging device 84 includes camera 290 and camera moving device 292. Camera moving device 292 includes guide rail 296 and slider 298. Guide rail 296 is fixed to main body 80 above component supply apparatus 88 so as to extend in the width direction (X direction) of loose component supply device 32. Slider 298 is slidably attached to guide rail 296, and can be slid to any position by operation of electromagnetic motor 299 (refer to FIG. 14). Also, camera 290 is attached to slider 298 facing downwards.

(c) Component Transfer Device

As shown in FIG. 3, component transfer device 86 includes component holding head moving device 300, component holding head 302, and two shuttle devices 304.

Component holding head moving device 300 includes X-direction moving device 310, Y direction moving device 312, and Z-direction moving device 314. Y direction moving device 312 includes Y slider 316 provided above component supply unit 82 and extending in the X direction, and Y slider 316 is moved to any position in the Y direction by operation of electromagnetic motor 319 (refer to FIG. 14). X-direction moving device 310 includes X slider 320 provided on a side surface of Y slider 316, and X slider 320 is moved to any position in the X direction by operation of electromagnetic motor 321 (refer to FIG. 14). Z-direction moving device 314 includes Z slider 322 provided on a side surface of X slider 320, and Z slider 322 is moved to any position in the Z direction by operation of electromagnetic motor 323 (refer to FIG. 13).

Figure 12:
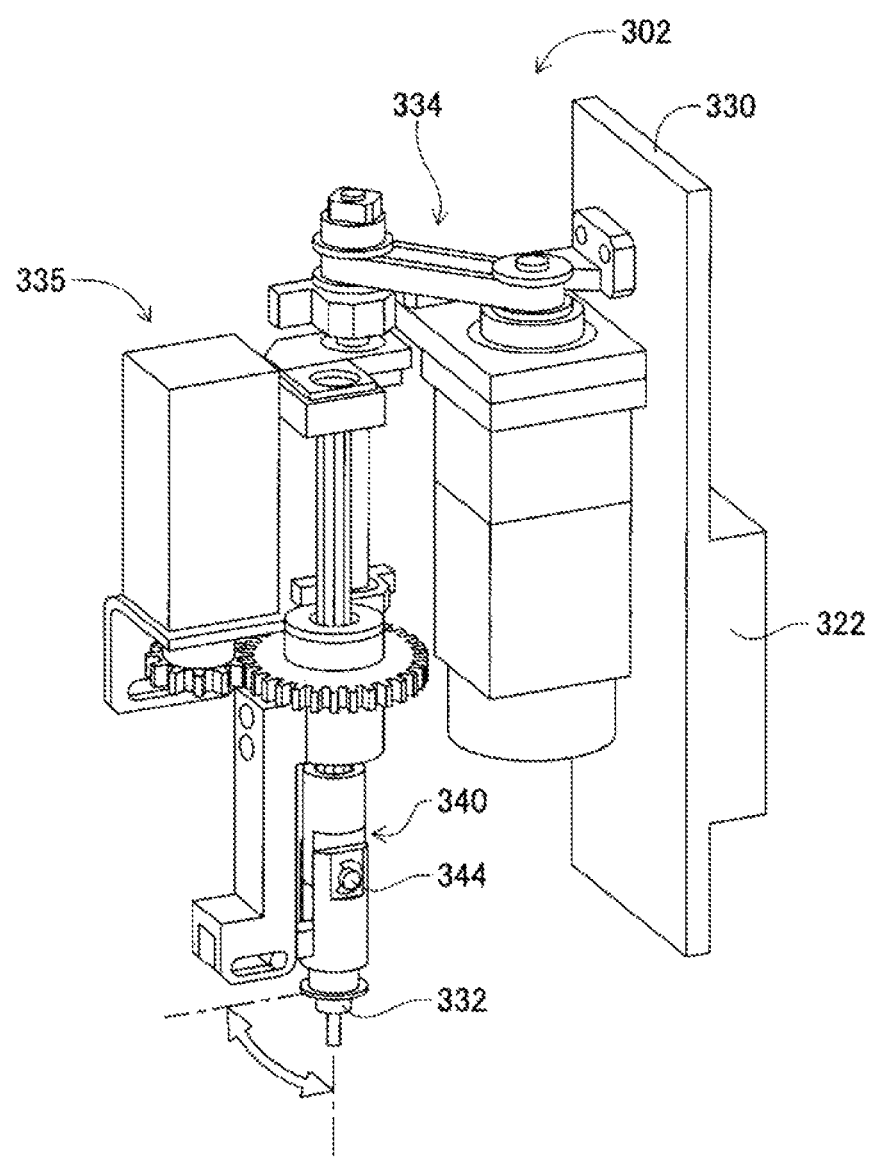
FIG. 12 is a perspective view of a component holding head.

As shown in FIG. 12, component holding head 302 includes head main body 330, suction nozzle 332, nozzle pivoting device 334, and nozzle rotating device 335. Head main body 330 is formed as one body with Z slider 322. Suction nozzle 332 is for holding a component, and is detachably attached to a lower end section of holder 340. Holder 340 is able to bend at support shaft 344, and holder 340 bends 90 degrees in an up direction by operation of nozzle pivoting device 334. By this, suction nozzle 332 attached to the bottom end of holder 340 is pivoted 90 degrees to be positioned at the pivoted position. That is, suction nozzle 332 is able to be pivoted to and from a non-pivoted position and a pivoted position by operation of nozzle pivoting device 334. Further, nozzle rotating device 335 rotates suction nozzle 332 around its own center axis.

Further, as shown in FIG. 3, each of the two shuttle devices 304 includes component carrier 388, and component carrier moving device 390, and is fixed to main body 80 lined up in the sideways direction on the front side of component supply unit 82. Five component receiving members 392 are attached to component carrier 388 lined up in a single row sideways, and components are loaded on each component receiving member 392.

Figure 13:
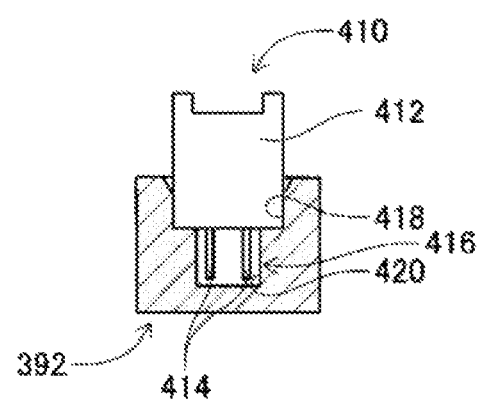
FIG. 13 shows a component receiving member in which is stored a leaded component.

In detail, as shown in FIG. 13, components supplied by loose component supply device 32 are electronic circuit components 410 that have leads (hereinafter also referred to as "leaded components"), being configured from a block-like component main body 412, and two leads 414 that protrude from the bottom surface of component main body 412. Also, component reception recess 416 is formed in component receiving member 392. Component reception recess 416 is a stepped recess configured from main body section reception recess 418 open at the top surface of component receiving member 392, and lead reception recess 420 open at the bottom surface of main body section reception recess 418. Leaded component 410 is inserted inside component reception recess 416 with leads 414 pointing downwards. Therefore, leaded component 410 is loaded inside component reception recess 416 with leads 414 inserted into lead reception recess 420 and component main body 412 inserted into main body section reception recess 418.

Also, as shown in FIG. 3, component carrier moving device 390 is a long plate member provided on the front side of component supply unit 82 and extending in the front-rear direction. Component carrier 388 is provided on the upper surface of component carrier moving device 390 to be slidable in the front-rear direction, and is slid to any position in the front-rear direction by operation of electromagnetic motor 430 (refer to FIG. 14). Note that, component carrier 388, when slid in a direction approaching component supply unit 82, is slid to a component receiving position that is positioned within the movement range of component holding head 302 by component holding head moving device 300. Conversely, when slid in a direction away from component supply unit 82, component carrier 388 is slid to a component supply position that is positioned within the movement range of work heads 60 and 62 by work head moving device 64.

Figure 14:
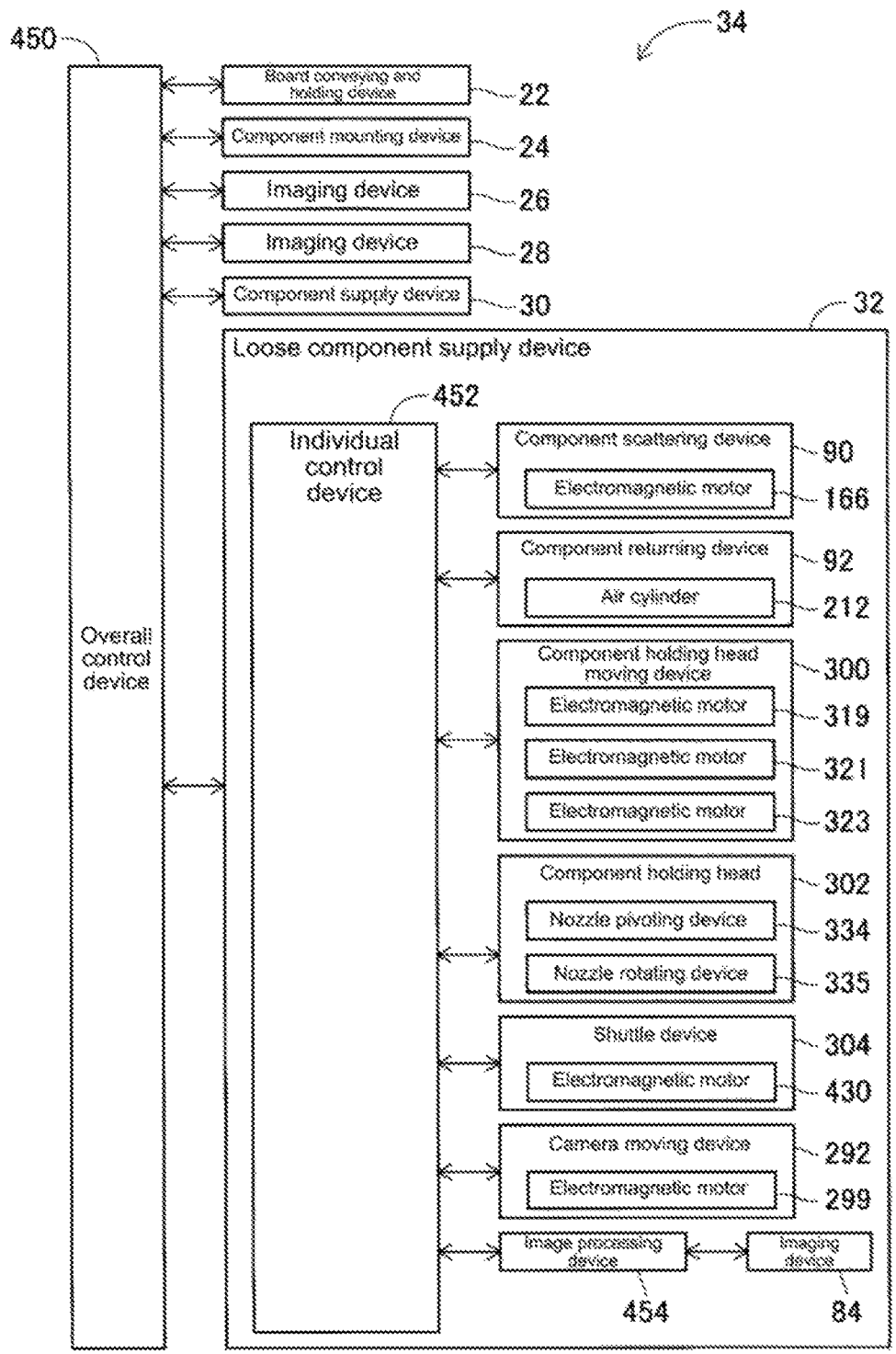
FIG. 14 is a block diagram showing a control device of the component mounter.

Further, as shown in FIG. 14, control device 34 includes overall control device 450, multiple individual control devices (only one is shown in the figure) 452, and image processing device 454. Overall control device 450 is configured mainly from a computer and is connected to board conveying and holding device 22, component mounting device 24, imaging device 26, imaging device 28, component supply device 30, and loose component supply device 32. Thus, overall control device 450 performs overall control of board conveying and holding device 22, component mounting device 24, imaging device 26, imaging device 28, component supply device 30, and loose component supply device 32. The multiple individual control devices 452 are configured mainly from a computer and are provided corresponding to board conveying and holding device 22, component mounting device 24, imaging device 26, imaging device 28, component supply device 30, and loose component supply device 32 (in the figure, only individual control device 452 corresponding to loose component supply device 32 is shown). Individual control device 452 of loose component supply device 32 is connected to component scattering device 90, component returning device 92, camera moving device 292, component holding head moving device 300, component holding head 302, and shuttle device 304. Individual control device 452 of loose component supply device 32 controls component scattering device 90, component returning device 92, camera moving device 292, component holding head moving device 300, component holding head 302, and shuttle device 304. Also, image processing device 454 is connected to imaging device 84 and processes image data captured by imaging device 84. Image processing device 454 is connected to individual control device 452 of loose component supply device 32. By this, individual control device 452 of loose component supply device 32 acquires image data captured by imaging device 84.

Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, imaging device 26 moves above circuit board 12 and images circuit board 12. By this, information related to a holding position error of circuit board 12 is obtained. Also, component supply device 30 or loose component supply device 32 supplies components at a specified supply position. Component supply by loose component supply device 32 is described in detail later. One of the work heads 60 or 62 moves above the component supply position and holds a component using suction nozzle 66. Then, work head 60 or 62 holding the component moves above imaging device 28, and the component being held by suction nozzle 66 is imaged by imaging device 28. Accordingly, information related to an error of the holding position of the component is obtained. Next, work head 60 or 62 holding the component moves above circuit board 12, and mounts the held component on circuit board 12 after correcting for the error in the holding position of circuit board 12 and the error in the holding position of the component and so on.

Loose Component Supply Device Operation (a) Supply of Leaded Components Using Loose Component Supply Device With loose component supply device 32, leaded components 410 are inserted by an operator into component supply apparatus 88, then the inserted leaded components 410 are supplied in a state loaded on component receiving member 392 of component carrier 388 by operation of component supply unit 82 and component transfer device 86. In detail, the operator inserts leaded components 410 via the opening at the top of component supply apparatus 88. Here, component supporting member 150 is moved below component supply apparatus 88 by operation of component support member moving device 152 to be in a stored state (refer to FIG. 6). With component support member 150 in a stored state, component collection container 180 positioned at the front end of component support member 150 is positioned in front of component supply apparatus 88, and the opening of collection section 202 is oriented facing up (collection orientation).

Leaded components 410 inserted via the opening on the top surface of component storage apparatus 88 fall onto inclined plate 104 of component storage apparatus 88 and roll down to the front lower end of inclined plate 104. Here, leaded components 410 that have rolled down to the front bottom end of inclined plate 104 pile up between the front bottom end of inclined plate 104 and the rear bottom end of conveyor device 106. Then, when rotating device 114 of conveyor device 106 is operated, conveyor belt 112 of conveyor device 106 is rotated counterclockwise as shown in FIG. 5. By this, leaded components 410 piled up between the front bottom end of inclined plate 104 and the rear bottom end of conveyor device 106 are conveyed by conveyor belt 112 diagonally up and forward. Here, because protrusions 115 are formed on the conveyance surface of conveyor belt 112 extending across the width (X direction) of component supply apparatus 88, leaded components 410 are caught by protrusions 115 to be conveyed diagonally up by conveyor belt 112.

Then, leaded components 410 conveyed diagonally up by conveyor belt 112 pass between the upper end on the front side of conveyance device 106 and brush 118 and fall onto inclined plate 120 provided below the upper end on the front side of conveyance device 106 and brush 118. Leaded components 410 that have fallen onto inclined plate 120 roll towards the rear of inclined plate 120 onto inclined plate 122 provided below inclined plate 120. Then, leaded components 410 that have fallen onto inclined plate 122 roll towards the front and are discharged from the opening at the front of component supply apparatus 88. In this manner, leaded components 410 that have fallen from the front end of conveyor device 106 fall onto inclined plate 120 and then onto inclined plate 122. Then, leaded components 410 are discharged from the opening at the front of component supply apparatus 88. By this, damage to leaded components 410 due to falling is reduced.

Component support member 150 is moved towards the front from under component supply apparatus 88 due to operation of component supply member moving device 152 at the time that leaded components 410 are discharged from the front side of component supply apparatus 88. By this, leaded components 410 discharged from the opening at the front of component supply apparatus 88 are discharged onto the upper surface of stage 156 of component support member 150.

Leaded components 410 that have been discharged onto stage 156 from component supply apparatus 88 roll forward, though even if they roll and fall from the front of stage 156 they are stored in component collection container 180. Also, if leaded components 410 that have been discharged onto stage 156 from component supply apparatus 88 roll sideways, they are prevented from falling from stage 156 by side walls 158 of component support member 150.

Then, component support member 150 is moved forward from the stored state to the exposed state and then movement of component support member 150 is stopped. By this, leaded components 410 are scattered across the entire upper surface of stage 156. With component supply apparatus 88, operation of conveyor device 106 is stopped to match the timing of the stopping of the operation of component support member 150 such that leaded components 410 are discharged finally from component supply apparatus 88.

Figure 15:
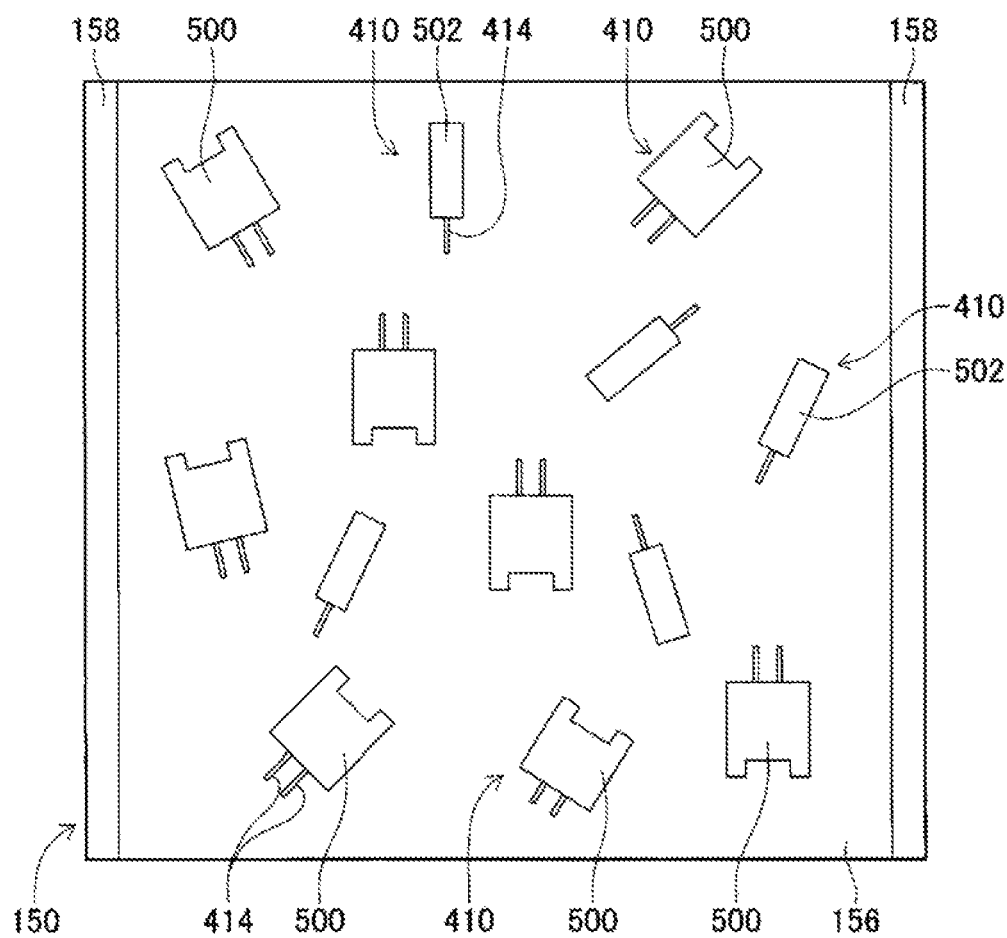
FIG. 15 shows leaded components scattered on a stage.

Then, when leaded components 410 are scattered on stage 156 of component support member 150 from component storage apparatus 88, as shown in FIG. 15, leaded components 410 are scattered on stage 156 in largely two orientations. Specifically, leaded components 410 are scattered on stage 156 in the following two orientations: an orientation in which the two leads 414 are in a state approximately lined up in a horizontal direction (also referred to as a "first orientation"), and an orientation in which the two leads 414 are in a state approximately lined up in a vertical direction (also referred to as a "second orientation").

When leaded components 410 are scattered on stage 156 as above, camera 290 of imaging device 84, by operation of camera moving device 292, moves above component support member 150 and images leaded components 410. Then, based on the image data imaged by camera 290, a leaded component that is a target for pickup (also referred to as "pickup target component") is identified.

Specifically, based on image data of camera 290, the orientation and position of each of the multiple components scattered on stage 156 is calculated. Then, only leaded components 410 for which the calculated component orientation was the first orientation are identified as pickup target components. This is because, for leaded components 410 in the first orientation, side surface 500 with a large surface area is facing upwards, and it is possible to hold side surface 500 with suction nozzle 332, but for leaded components 410 in the second orientation, side surface 502 with a small surface area is facing upwards, and it is not possible to hold side surface 502 using suction nozzle 332.

Then, when a pickup target component has been identified, that pickup target component is picked up and held by suction nozzle 332. Note that, when the pickup target component is picked up and held by suction nozzle 332, suction nozzle 332 is in the non pivoted position. Then, after holding leaded component 410 using suction nozzle 332, component holding head 302 is moved above component carrier 388. Then, component carrier 388 is moved to the component receiving position by operation of component carrier moving device 390. Also, when component holding head 302 is moved above component carrier 388, suction nozzle 332 is pivoted to the pivoted position. Note that, suction nozzle 332 is rotated by operation of nozzle rotating device 335 such that leads 414 of the leaded component 410 held by suction nozzle 332 that is in the pivoted position face downwards in a vertical direction.

When component holding head 302 is moved above component carrier 388, leaded component 410 in a state with leads 414 facing downwards in the vertical direction is inserted into component reception recess 416 of component reception member 392. By this, as shown in FIG. 13, leaded component 410 is loaded in component receiving member 392 with leads 414 facing vertically downwards.

Also, when leaded component 410 is loaded on component receiving members 392, component carrier 388 is moved to the component supply position by operation of component carrier moving device 390. With loose component supply device 32, because component carrier 388 moved to the component supply position is within the movement range of work heads 60 and 62, leaded components 410 are supplied at this position. In this manner, with loose component supply device 32, leaded components 410 are supplied with leads 414 pointing downwards, and with the upper surface that is opposite to the bottom surface to which leads 414 are connected facing upwards. Therefore, suction nozzle 66 of work head 60 or 62 is able to appropriately hold leaded component 410.

(b) Collection and Replenishment of Leaded Components

With loose component supply device 32, when pickup target components are scattered on stage 156 of component support member 150, pickup of the scattered pickup target components is repeated and the picked up pickup target components are loaded on component receiving member 392. Then, by component carrier 388 mounted on component receiving member 392 being moved to the component supply position, supply of leaded components 410 is performed. However, if there are no pickup target components scattered on stage 156 of component support member 150, that is, all the leaded components 410 in the first orientation that can be picked up have been picked up and only leaded components 410 in the second orientation or the like that cannot be picked up remain on stage 156, it is no longer possible to pick up a leaded component 410 from stage 156.

Thus, with loose component supply device 32, in such a case, leaded components 410 remaining on stage 156 are collected in component collection container 180. Then, leaded components 410 collected into component collection container 18 are scattered again onto stage 156, and by doing so the orientation of the leaded components 410 changes such that pickup of leaded components 410 from stage 156 can be restarted. However, if the quantity of leaded components 410 collected in component collection container 180 is small, it is possible that the quantity of pickup target components on stage 156 will be too small even though leaded components 410 collected in component collection container 180 have been re-scattered onto stage 156. Therefore, in such a case, it is desirable that not only are leaded components 410 collected in component collection container 180 re-scattered, but that leaded components 410 are replenished from component supply apparatus 88. That is, it is desirable that leaded components 410 from both component collection container 180 and component supply apparatus being replenished onto stage 156. Considering this, if the quantity of leaded components remaining on stage 156 is equal to or less than a predetermined set quantity, leaded components 410 are replenished onto stage 156 from both component collection container 180 and component supply apparatus 88, but if the quantity of leaded components remaining on stage 156 is greater than the predetermined set quantity, leaded components 410 are replenished onto stage 156 from only component collection container 180 only.

Detailed descriptions are given below about replenishing leaded components 410 from both component collection container 180 and component supply apparatus onto stage 156. First, component support member 150 is moved below component supply apparatus 88 by operation of component support member moving device 152. That is, component support member 150 is moved from the exposed state (refer to FIG. 5) towards the stored state (refer to FIG. 6). Here, component collection container 180 provided at the front end of component support member 150 is oriented such that the opening of collecting section 202 is facing up, that is, the collection orientation. Then, when component support member 150 is moved from the exposed state towards the stored state, leaded components 410 are discharged onto stage 156 of component support member 150 from component supply apparatus 88. Note that, because the discharge of leaded components 410 from component supply apparatus 88 is performed in the same manner to the procedure described above, descriptions are omitted here.

Figure 6:
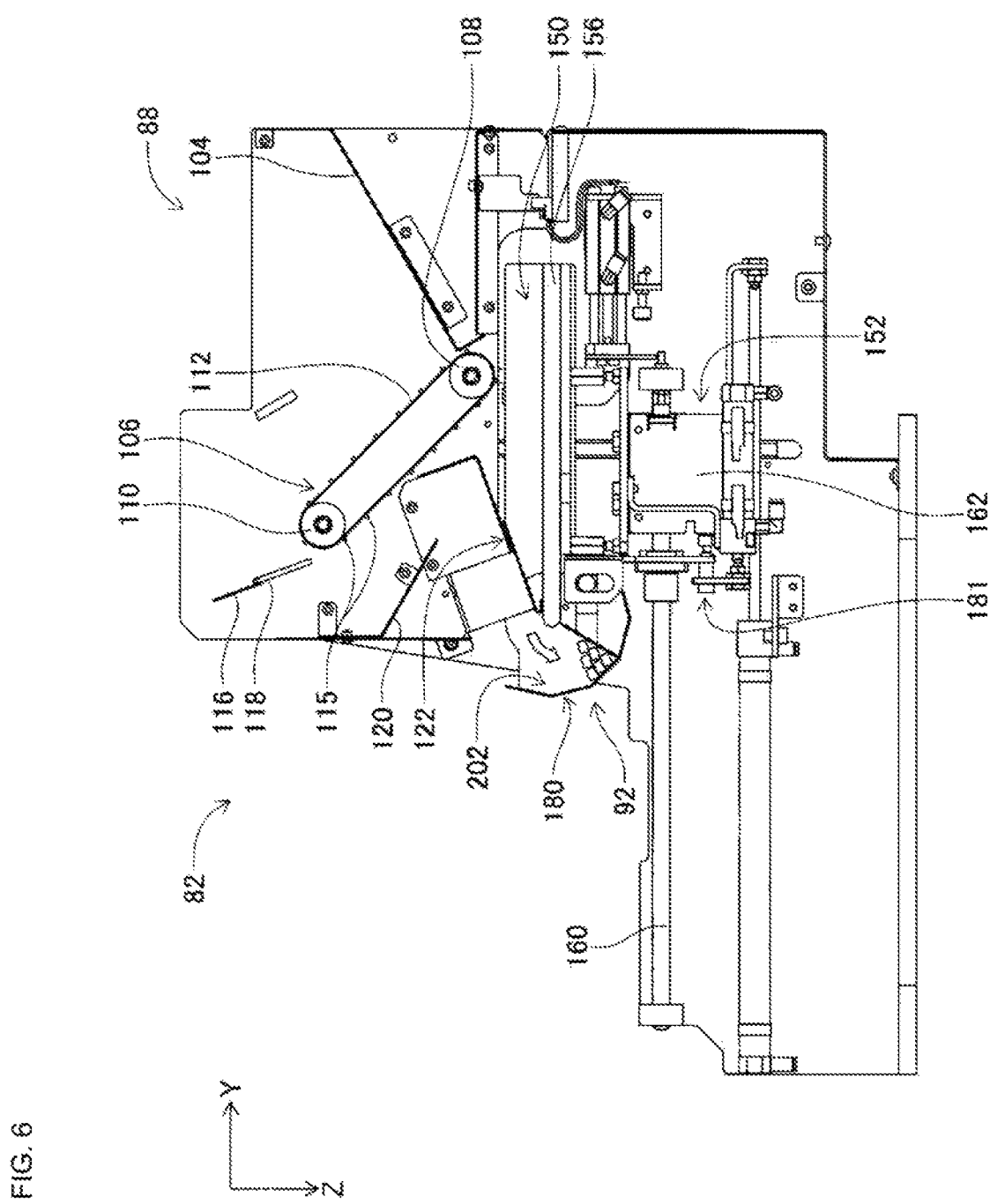
FIG. 6 is a cross section view of the component supply unit.
Figure 16:
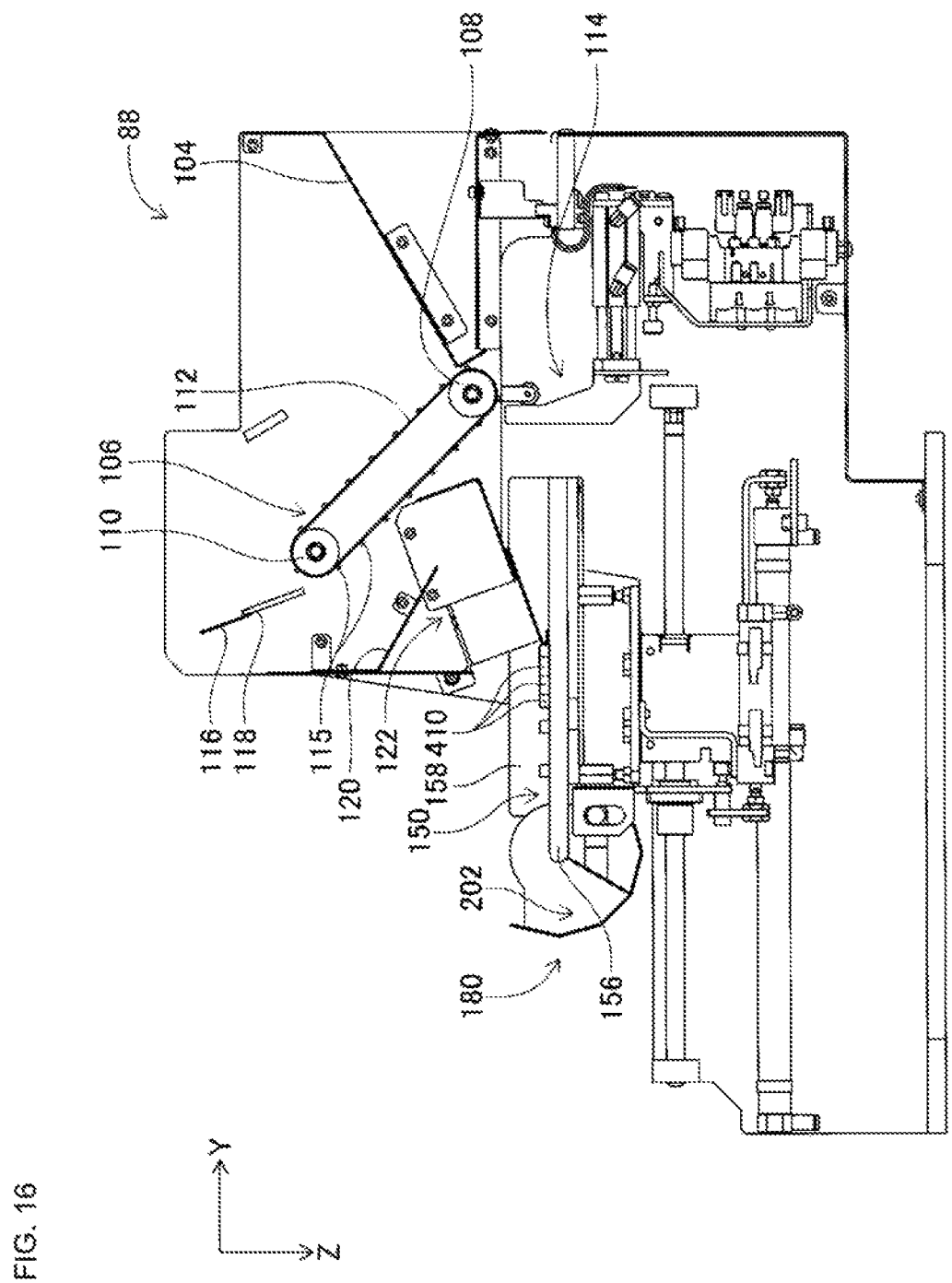
FIG. 16 is a cross section view of the component supply unit.

After the discharging of leaded components 410 from component supply apparatus 88, on stage 156 there are leaded components 410 that remained on stage 156 from before the discharging of leaded components 410 from component supply apparatus 88 and there are leaded components 410 newly discharged from component supply apparatus 88. Note that, also when leaded components 410 are discharged from component supply apparatus 88, component support member 150 moves towards the stored state. Therefore, as shown in FIG. 16, leaded components 410 on stage 156 of component support member 150 are stopped by the front end of inclined plate 122 of component supply apparatus 88 in accordance with the movement of component support member 150. Further, as shown in FIG. 6, when component support member 150 reaches the stored state, leaded components 410 on stage 156 fall inside component collection container 180. By this, leaded components 410 remaining on stage 156 are collected in component collection container 180. In other words, leaded components 410 discharged from component supply apparatus 88 when component support member 150 was moving towards the stored state and leaded components 410 remaining on stage 156 from before the leaded components 410 were discharged from component supply apparatus 88 are collected in component collection container 180.

According to the above procedure, when leaded components 410 are collected in component collection container 180, those leaded components 410 are replenished onto stage 156. In detail, when collection of leaded components 410 into component collection container 180 is complete, as shown in FIG. 6, component support member 150 is in the stored state. Therefore, component support member 150 is moved from the stored state towards the front by the operation of component support member moving device 152. Note that, when component support member 150 is moved forwards from the stored state, conveyor device 106 of component supply apparatus is not operated. That is, leaded components 410 are not discharged onto stage 156 from component supply apparatus 88.

Also, when component support member 150 has been moved forward from the stored state by a specified amount, container swinging device 181 of component returning device 92 is operated and component collection container 180 is swung. Note that, when component collection container 180 is swung, the specified amount that component support member 150 is moved forward from the stored state is set in advance, with a specified area of stage 156 to which replenishment of leaded components 410 from component collection container 180 is to occur set as the movement quantity of component support member 150 when being exposed from below component supply apparatus 88. Also, movement of component support member 150 does not stop even when component collection container 180 swings. That is, component collection apparatus 180 swings while component support member 150 is moving.

In detail, when component support member 150 has been moved forward from the stored state by the specified amount, air cylinder 212 of container swinging device 181 is extended from the retracted state. Here, air cylinder 212 is extended relatively fast and in one go, so component collection container 180 is swung hard. That is, the orientation of component collection container 180 is changed suddenly from an orientation with the opening of collecting section 202 facing up (collection orientation) to an orientation with the opening of collecting section 202 facing stage 156 (returning orientation). Therefore, leaded components 410 collected in component collection container 180 are discharged with strong force towards stage 156. In particular, as described above, because bottom surface 184 of component collection container 180 has an arced shape, leaded components 410 collected in component collection container 180 accelerate along the arced bottom surface 184 to be discharged with strong force towards stage 156.

Thus, components collected in component collection container 180 are discharged to a location relatively far from component collection container 180, such that the leaded components 410 are scattered across a relatively wide range of stage 156. That is, leaded components 410 collected in component collection container 180 are replenished onto stage 156 in a scattered state. Note that, as described above, when component collection container 180 is swung, component support member 150 also moves, and when reaching the exposed state, movement of component support member 150 is stopped. Also, after leaded components 410 have been scattered on stage 156 from component collection container 180, air cylinder 212 is retracted, and the orientation of component collection container 180 returns from the orientation with the opening of collecting section 202 facing stage 156 (returning orientation) to the orientation with the opening of collecting section 202 facing up (collection orientation).

Further, when leaded components 410 are replenished onto stage 156 from only component collection container 180, in the same manner as when leaded components are replenished from both component collection container 180 and component supply apparatus 88, first, component support member 150 is moved from the exposed state towards the stored state. However, leaded components 410 are not replenished from component supply apparatus 88. Leaded components 410 on stage 156 are stopped by the front end of inclined plate 122 of component supply apparatus 88 in accordance with the movement of component support member 150. Further, by moving component support member 150 to the stored state, leaded components 410 on stage 156 fall inside component collection container 180. By this, leaded components 410 remaining on stage 156 are collected in component collection container 180. Here, for component collection container 180, only leaded components 410 remaining on stage 156 after pickup from stage 156 are collected in component collection container 180. When component support member 150 reaches the stored state, component support member 15 is moved again towards the exposed state. In this case, component collection container 180 is swung based on the above procedure. By this, leaded components 410 collected in component collection container 180 are replenished onto stage 156.

In this manner, with loose component supply device 32, leaded components 410 are replenished onto stage 156 from both component collection container 180 and component supply apparatus 88 or from only component collection container 180, in accordance with the quantity of leaded components 410 remaining on stage 156. When leaded components 410 are replenished onto stage 156 from both component collection container 180 and component supply apparatus 88 or from only component collection container 180, the leaded components 410 replenished onto stage 156 are imaged by camera 290 of imaging device 84, and based on the image data captured by camera 290, pickup target components are identified again. Then, the identified pickup target components are picked up and held by suction nozzle 332 and, according to a procedure described above, supply of the leaded components 410 is performed by loose component supply device 32.

That is, with loose component supply device 32, when there are no more leaded components 410 orientated on stage 156 such that pickup is possible and only leaded components 410 for which pickup is not possible remain, the leaded components 410 for which pickup is not possible are collected into component collection container 180. Alternatively, the leaded components 410 for which pickup is not possible and leaded components 410 discharged onto stage 156 from component supply apparatus 88 are collected in component collection container 180. Then, the leaded components 410 collected in component collection container 180 are re-scattered on stage 156, such that the orientation of the leaded components 410 on stage 156 is changed. By this it is possible to replenish leaded components 410 onto stage 156 in an orientation for which pickup is possible in a relatively short time.

Also, when leaded components 410 collected in component collection container 180 are scattered on stage 156 by component collection container 180 being swung, component support member 150 is not stopped. That is, leaded components 410 collected on component collection container 180 are replenished onto stage 156 while component support member 150 is moving. By this, it is possible to return component support member 150 to a state in which there are leaded components 410 on stage 156 for which pickup is possible, that is, to return component support member 150 to an exposed state, in a shorter time.

Note that, loose component supply device 32 is an example of a component supply device. Inclined plate 122 is an example of a stopping member and a collection device. Component support member 150 is an example of a component support member. Component support member moving device 152 is an example of a moving device and a collection device. An upper surface of stage 156 is an example of a support surface. Component collection container 180 is an example of a collection container. Container oscillating device 181 is an example of a container orientation changing device.

Further, the present disclosure is not limited to the above example embodiments, and various changed or improved methods of embodiment are possible based on the knowledge of someone skilled in the art. Specifically, for example, in an embodiment above, bottom surface 184 of component collection container 180 is bent in an arc shape, but it may be bent in multiple angled steps.

Also, in an embodiment above, component collection container 180 is swung such that leaded components 410 collected in component collection container 180 are scattered onto stage 156, but the movement is not limited to swinging, component collection container 180 may be moved in a straight line to change the orientation of component collection container 180 such that leaded components 410 collected in component collection container 180 are scattered onto stage 156.

Also, in an embodiment above, component support member 150 is moved below component supply apparatus 88 such that leaded components 410 remaining on stage 156 are collected in component collection container 180, but a contacting member may be provided on component support member 150 at a height to contact scattered leaded components 410, and the contacting member may be moved towards component collection container 180 such that leaded components 410 are gathered by the contact member and collected in component collection container 180.

Further, in an embodiment above, when an operator inserts leaded components 410 into component supply apparatus 88, component support member 150 is moved to the stored state, but the configuration may be such that an operator can insert leaded components 410 into component supply apparatus 88 whatever position component support member 150 is moved to.

Also, in an embodiment above, when component support member 150 is moved from the exposed state to the stored state when leaded components 410 are replenished onto stage 156 from both component collection container 180 and component supply apparatus 88, leaded components 410 are discharged from component support member 150, but leaded components 410 may be discharged from component supply apparatus 88 when component support member 150 is moved from the stored state to the exposed state. In other words, in an embodiment above, leaded components 410 discharged from component supply apparatus onto stage 156 may be temporarily collected in component collection container 180 and then replenished onto stage 156 from component collection container 180. However, by discharging leaded components 410 from component supply apparatus 88 when component support member 150 is moved from the stored state to the exposed state, leaded components 410 discharged from component supply apparatus 88 remain scattered on stage 156 without being collected in component collection container 180. That is, when component support member 150 is moved from the stored state to the exposed state, leaded components 410 are replenished onto stage 156 from component supply apparatus 88, and by the swinging of component collection container 180 leaded components 410 are replenished onto stage 156 from component collection container 180.

Also, in embodiments above, the present disclosure is applied to leaded components, but the present disclosure may be applied to various types of components. Specifically, for example, the present disclosure may be applied to configuration components of solar panels, configuration components of power modules, electronic components without leads, and so on.

REFERENCE SIGNS LIST

32: loose component supply device (component supply device);
122: inclined plate (stopping member) (collection device);
150: component support member (component support section);
152: component support member moving device (moving device) (collection device);
156: stage (support surface);
180: component collection container (collection container)
181: container oscillating device (container orientation changing device)

The invention claimed is:

1. A component supply device comprising:
a component support section configured to support multiple components, the component support section including a support surface extending in a length direction of the component support section and arranged as a plate on which the components are supported in a scattered state;
a collection container arranged next at an end of the support surface in the length direction and configured to collect the components supported on the support surface via an opening in the collection container;
a collection device configured to cause the components supported on the support surface to be collected inside the collection container via the opening in the collection container, the collection container is configured to swing around an axis towards the support surface; and
a container orientation changing device configured to scatter the components collected inside the collection container on the support surface by changing the orientation of the collection container by swinging the collection chamber such that the opening of the collection container faces the support surface.

2. The component supply device according to claim 1, wherein
the container orientation changing device scatters the components collected inside the collection container on the support surface by swinging the collection container towards the support surface such that the opening of the collection container faces the support surface.

3. The component supply device according to claim 2 wherein
a bottom section of the collection container is curved in an arc shape or angled in multiple steps towards a swinging direction of the collection container.

4. A component supply device comprising:
a component support section configured to support multiple component in a scattered state on a support surface;
a collection container arranged next to the component support section and configured to collect the components supported on the support surface via an opening in the collection container;
a collection device configured to cause the components supported on the support surface to be collected inside the collection container via the opening in the collection container; and
a container orientation changing device configured to scatter the components collected inside the collection container on the support surface by changing the orientation of the collection container such that the opening of the collection container faces the support surface, wherein
the collection device includes
a stopping member provided at a height at which contact is possible with the components supported on the support surface, and
a moving device configured to relatively move the stopping member and the component support section such that the stopping member relatively moves towards and away from the collection container, and
is configured to stop the components supported on the support surface using the stopping member and to collect the stopped components inside the collection container via the opening in the collection container by relatively moving the stopping member and the component support section such that the stopping member relatively moves towards the collection container, and
the container orientation changing device is configured to, after the components stopped by the stopping member have been collected inside the collection container via the opening of the collection container, change the orientation of the collection container when relatively moving the stopping member and the component support section such that the stopping member relatively moves away from the collection container.

* * * * *